United States Patent
Kilmer et al.

(10) Patent No.: US 9,607,716 B2
(45) Date of Patent: *Mar. 28, 2017

(54) DETECTING DEFECTIVE CONNECTIONS IN STACKED MEMORY DEVICES

(71) Applicant: International Business Machines Corporation, Armonk, NY (US)

(72) Inventors: Charles A. Kilmer, Essex Junction, VT (US); Warren E. Maule, Cedar Park, TX (US); Saravanan Sethuraman, Bangalore (IN)

(73) Assignee: Internatiional Business Machines Corporation, Armonk, NY (US)

( * ) Notice: Subject to any disclaimer, the term of this patent is extended or adjusted under 35 U.S.C. 154(b) by 160 days.

This patent is subject to a terminal disclaimer.

(21) Appl. No.: 14/248,480

(22) Filed: Apr. 9, 2014

(65) Prior Publication Data

US 2015/0179285 A1    Jun. 25, 2015

Related U.S. Application Data

(63) Continuation of application No. 14/138,838, filed on Dec. 23, 2013, now Pat. No. 9,263,157.

(51) Int. Cl.
*G11C 11/412* (2006.01)
*G11C 11/413* (2006.01)
(Continued)

(52) U.S. Cl.
CPC ...... *G11C 29/50004* (2013.01); *G11C 29/022* (2013.01); *G11C 29/025* (2013.01);
(Continued)

(58) Field of Classification Search
USPC .................................................. 365/200, 201
See application file for complete search history.

(56) References Cited

U.S. PATENT DOCUMENTS 5,757,817 A    5/1998 Bolyn et al.
8,242,589 B2   8/2012 Saen et al.
(Continued)

OTHER PUBLICATIONS

Beyne et al., "Failure Analysis for 3D TSV Systems," Stress Management for 3D IC's Using Through Silicon Vias: Product-Level Reliability Workshop Marriott Marquis, San Francisco, CA. Jul. 14, 2011. © IMEC 2011.

(Continued)

*Primary Examiner* — Hoai V Ho
*Assistant Examiner* — Minh Dinh
(74) *Attorney, Agent, or Firm* — Wood, Herron & Evans, LLP; Robert R. Williams

(57) ABSTRACT

A method for testing a stacked memory device having a plurality of memory chips connected to and arranged on top of a logic chip for a connection defect is disclosed. The method may include testing a memory chip by writing a data value into a first location in the memory chip, reading a data value from the first location, detecting a first bit error and recording a bit number of the first bit error. The method may also include testing the memory chip by writing a data value into a second location in the memory chip, reading a data value from the second location in the memory chip, detecting a second bit error and recording a bit number of the second bit error. The method may also include replacing a connection common to the first and second bit errors with a spare connection.

4 Claims, 5 Drawing Sheets

(51) Int. Cl.
| | |
|---|---|
| *G11C 29/50* | (2006.01) |
| *G11C 29/00* | (2006.01) |
| *G11C 29/02* | (2006.01) |
| *H01L 23/538* | (2006.01) |
| *H01L 25/065* | (2006.01) |
| *H01L 23/48* | (2006.01) |
| *H01L 23/498* | (2006.01) |
| *H01L 23/00* | (2006.01) |
| *H01L 25/18* | (2006.01) |

(52) U.S. Cl.
CPC ............ *G11C 29/70* (2013.01); *G11C 29/702* (2013.01); *H01L 23/5384* (2013.01); *H01L 25/0657* (2013.01); H01L 23/481 (2013.01); H01L 23/49816 (2013.01); H01L 24/13 (2013.01); H01L 24/16 (2013.01); H01L 25/0652 (2013.01); H01L 25/18 (2013.01); H01L 2224/131 (2013.01); H01L 2224/13025 (2013.01); H01L 2224/13188 (2013.01); H01L 2224/16145 (2013.01); H01L 2224/16146 (2013.01); H01L 2224/16225 (2013.01); H01L 2224/16227 (2013.01); H01L 2225/06513 (2013.01); H01L 2225/06517 (2013.01); H01L 2225/06541 (2013.01); H01L 2225/06565 (2013.01); H01L 2924/15192 (2013.01); H01L 2924/15311 (2013.01)

(56) References Cited

U.S. PATENT DOCUMENTS

| | | | |
|---|---|---|---|
| 8,384,201 | B2 | 2/2013 | Chen et al. |
| 8,384,417 | B2 | 2/2013 | Laisne et al. |
| 8,384,430 | B2 | 2/2013 | Tseng et al. |
| 9,136,021 | B2 * | 9/2015 | Yang .................... H01L 25/0657 |
| 9,263,157 | B2 * | 2/2016 | Kilmer .................... G11C 29/70 |
| 2010/0005376 | A1 | 1/2010 | LaBerge et al. |
| 2012/0124532 | A1 | 5/2012 | Coteus et al. |
| 2012/0248438 | A1 | 10/2012 | Lung et al. |
| 2013/0002272 | A1 | 1/2013 | Badaroglu et al. |
| 2013/0031439 | A1 | 1/2013 | Moon et al. |
| 2013/0052760 | A1 | 2/2013 | Cho et al. |
| 2013/0151912 | A1 | 6/2013 | Sevugapandian |

OTHER PUBLICATIONS

Huang et al., "A Built-In Self-Test Scheme for the Post-Bond Test of TSVs in 3D ICs," 29th IEEE VLSI Test Symposium, May 2011, Dana Point, CA, © 2011 IEEE. D.O.I. 10.1109/VTS.2011.5783749.
Lee et al., "Yield Enhancement Techniques for 3D Memories by Redundancy Sharing Among All Layers," ETRI Journal, vol. 34, No. 3, Jun. 2012. © 2012 ETRI.
Loranger, M., "TSV Test," FormFactor Advanced Wafer Probe Solutions, Nov. 11, 2009, 14 pages, Seoul, Korea.
Marinissen, E., "Testing 3D Chips Containing Through-Silicon Vias," International Test Conference, Nov. 2009, pp. 1-11, Austin, TX © 2009 IEEE D.O.I. 10.1109/TEST.2009.5355573.
Unknown, "Hybrid Memory Cube Specification 1.0," Hybrid Memory Cube Consortium, 122 Pages, © 2013 Altera Corporation, ARM Ltd., Hewlett-Packard Company, International Business Machines Corporation, Micron Technology, Inc., Open-Silicon, Inc., Samsung Electronics Co., Ltd., SK Hynix, Inc., and Xilinx, Inc. http://hybridmemorycube.org/files/SiteDownloads/HMC_Specification%201_0.pdf.
Kilmer et al., "Detecting Defective Connections in Stacked Memory Devices," U.S. Appl. No. 14/138,838, filed Dec. 23, 2013.

\* cited by examiner

DETECTING DEFECTIVE CONNECTIONS IN STACKED MEMORY DEVICES

TECHNICAL FIELD

The present disclosure relates to memory devices. In particular, this disclosure relates to stacked, interconnected memory chips.

BACKGROUND

A through-silicon via (TSV) is a vertical electrical connection that may pass completely through a silicon die. TSVs may be formed in a silicon die by creating a hole through the die, for example, using an etching process, depositing an insulating/lining material on the surface of the hole and surrounding silicon, and filling the hole with a conductive material, such as tungsten, copper or aluminum. The conductive material may be used to electrically connect circuits formed on one planar side of a first silicon die to circuits of another die, stacked against the other planar side of the first die.

A TSV may be useful in enabling stacking and electrical interconnection of multiple integrated circuit (IC) chips to create high-density circuit structures having short interconnects, high performance, and high density. One such circuit structure may include a number of memory chips, and may be known as a stacked memory device. A stacked memory device may include a plurality of memory chips vertically interconnected to each other, and to a die that includes logic functions. Stacked memory device logic functions may include management of memory operations such as reading, writing, maintenance, and interface with external components such as a processor chip.

SUMMARY

Various aspects of the present disclosure may be useful for ensuring the integrity of data stored within a stacked memory device. A stacked or hybrid memory cube configured according to embodiments of the present disclosure may perform reliably, while experiencing little (or no) loss of performance, resulting from the detection and replacement of defective TSV connections.

Embodiments may be directed towards method for testing a stacked memory device having a plurality of memory chips arranged on top of, and having connections to, a logic chip, for a connection defect. The method may include performing a first test of a first memory chip of the plurality of memory chips. The first test may include writing a first write data value, designed to reveal a connection defect, into a first location in the first memory chip, and reading a first read data value from the first location in the first memory chip. The first test may also include detecting a first bit error corresponding to the first location in the first memory chip, and recording, in response to the first bit error, a first bit number corresponding to the first bit error. The method of testing a stacked memory device may also include performing a second test of the first memory chip. Performing the second test of the first memory chip may include writing a second write data value into a second location in the first memory chip, reading a second read data value from the second location in the first memory chip, and detecting a second bit error corresponding to the second location in the first memory chip. Performing the second test may also include recording, in response to the second bit error, a second bit number corresponding to the second bit error, and replacing, in response to the first recorded bit number being equal to the second recorded bit number, a connection common to the first and second bit errors, with a spare connection.

Embodiments may also be directed towards a stacked memory device. The stacked memory device may include a plurality of memory chips, each having a plurality of memory locations, a plurality of bit lines and a plurality of word lines. A stacked memory device may also include a logic chip having electrical connections to, and located beneath, each of the plurality of memory chips. The logic chip may be designed to write a write data value into a location of the plurality of memory locations in a memory chip of the plurality of memory chips, and to read a read data value from the location in the memory chip. The logic chip may also be designed to detect a bit error in the read data value, record a bit number corresponding to the detected bit error, and replace a defective connection between at least one of the plurality of memory chips and the logic chip, with a spare connection.

Aspects of the various embodiments may be used during manufacturing and assembly processes to increase stacked memory device yields. Aspects of embodiments may also be useful for providing cost-effective detection and isolation of bit errors caused by TSV and memory chip defects within a stacked memory device, by using existing and proven logic functions, and integrated circuit (IC) technologies.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Figure 1:
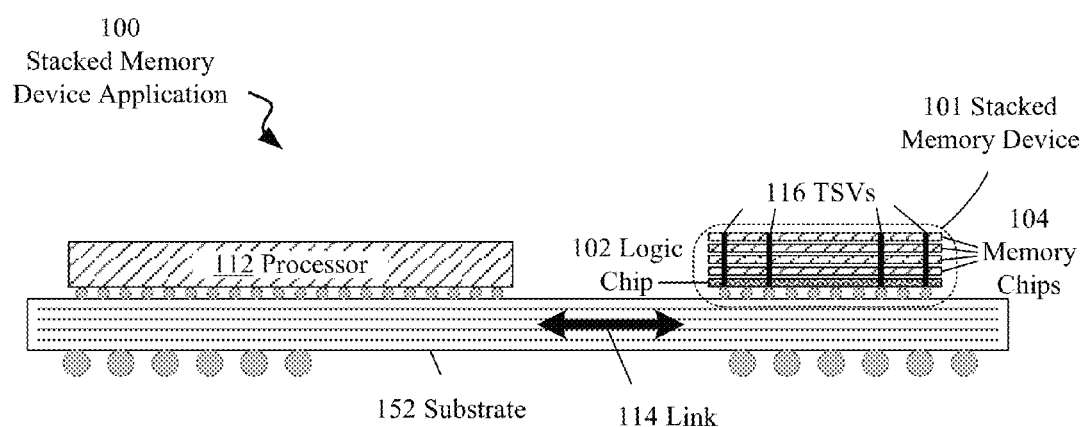
FIG. 1 is a cross-sectional drawing of a stacked memory device application including a processor, a stacked memory device, and a substrate containing a high-speed link, according to embodiments of the present disclosure.

Certain embodiments of the present disclosure can be appreciated in the context of a method for detecting and replacing defective connections in stacked memory devices that may be used in computer and electronic systems. Such stacked memory devices may include integrated circuit chips containing dynamic random-access memory (DRAM). While not necessarily limited thereto, embodiments discussed in this context can facilitate an understanding of various aspects of the disclosure. Certain embodiments may also be directed towards other methods and associated applications, such as a method for detecting memory chip errors in DRAM chips for use with, or inclusion within, stacked memory devices. Such methods may include, but are not limited to, detecting memory errors, correcting soft memory errors, and marking DRAM chips, or areas of DRAM chips containing hard memory errors as defective. Embodiments may also be directed towards detecting and correcting errors in other types of stacked memory devices that include SRAM, flash, and magnetoresistive memory chips.

Various embodiments of the present disclosure relate to a method for testing a stacked memory device that may determine if a memory bit error is caused by connection (TSV) defect or by a memory chip defect. The method may involve performing tests on various memory locations within one or more memory chips, which can be useful for indicating the source of the bit error. Memory device reliability may result from the use of the method for testing stacked memory devices. The method may indicate a defective TSV connection, or a defective memory chip, or memory chip location, which may be useful in replacing the defective connection, or marking a memory chip and/or location as unusable.

The method may be compatible with a variety of memory chip technology types, to provide robust defect indication while not limiting stacked memory device performance. The method for testing stacked memory devices may make use of application data (not generated for test purposes) stored within a memory device, and/or specific data patterns created to detect TSV and memory chip defects. The method may be employed during idle memory cycles and memory maintenance operations, which may result in little or no loss of stacked memory device performance. The method may also be used to detect a variety of types of TSV and memory chip defects created during various manufacturing and assembly processes, which may be useful in increasing stacked memory device yields. The method may be executed on existing hardware components such as a processor or logic chip, and may require no specialized hardware.

3-D interconnect structures such as through-silicon vias (TSVs) may provide electronic components, such as stacked memory devices, with advantages over devices having similar functionality, but constructed using conventional, individually packaged, memory chips. A stacked memory device may have increased density, capacity, and performance, and decreased overall physical size, footprint, access time, and power consumption, when compared to conventional (individually) packaged memory devices. A computer or electronic system constructed using stacked memory devices may directly benefit from each of the advantages of a stacked memory device.

A particular industry example of a stacked memory device may be known as a Hybrid Memory Cube (HMC). An HMC may include a plurality of memory chips electrically connected and physically mounted on top of a logic chip. The logic chip may function as an interface between the memory chips and other electronic or computer system components, such as a processor chip. The logic chip may also perform memory controller functions such as reading, writing, refresh and other maintenance operations related to the memory chips. Further definition and specification of the structure, function, operating and interface characteristics of hybrid memory cubes may be found in the Hybrid Memory Cube Specification 1.0, published by the Hybrid Memory Cube Consortium. An HMC may include one or more embodiments of a stacked memory device, but the present disclosure is not limited to the Hybrid Memory Cube Specification 1.0 (or other HMC specifications).

TSVs may exhibit defects, resulting from a number of causes, during a fabrication process, an assembly processes, and during normal operations of a device including TSVs. For example, during fabrication, a conductive material used to form the TSV may not completely fill the TSV hole, which may yield a high resistance or nonconductive TSV. During device assembly processes, conductive material, such as solder microbumps or other conductive structures, may not properly form electrical connections between adjacent TSVs, which may result in either open or shorted circuits. During operation of a device including adjacent chips connected with TSVs, differences in thermal expansion of the chips may cause the TSVs to crack due to thermal stress.

A physical or electrical TSV defect may result in functional failures of a device that includes them. For example, a TSV defect resulting in an open circuit within a stacked memory device may prohibit the reading and/or writing of a bit into a particular location within a memory chip. TSV defects within 3-D structures, such as stacked memory devices, may be difficult to locate, due to the small size and high density TSVs and the possible location of TSV defects within the 3-D structure. For example, a TSV defect may be located (hidden) on or between chips in the center of a stacked memory device, and may not be easily accessible.

Detecting the location of TSV defects may be difficult, time-consuming and costly, depending on the location of the defect, and the complexity of the 3-D device. Techniques such as X-ray imaging may not detect a small TSV defect that is hidden in a stack of multiple chips. Conventional probing techniques may be ineffective, due to the inaccessibility of probe points that may connect to the TSV defect. Disassembling a stacked memory device to locate a defect may be destructive to one or more chips included in the device. The use of built-in self test (BIST) functions within a stacked memory device may consume a large amount of silicon chip area, and a BIST operation may require the stacked memory device be functionally disabled to allow testing for defective TSVs. The cost of locating and repairing or replacing TSV connection defects may detract from, or negate, the cost, performance, and other advantages gained by including stacked memory devices in a particular system design. Certain embodiments relate to a method for testing a stacked memory device, and replacing a defective connection with a spare connection. In embodiments, the method may be executed while the stacked memory device is in use within a computer or other electronic system.

FIG. 1 is a cross-sectional drawing of a stacked memory device application 100, generally used for providing high-density, high-speed memory for use by a processor, according to embodiments of the present disclosure. The stacked memory device application may include a processor 112 and a stacked memory device 101, both mounted on a substrate 152, which may contain link 114, according to embodiments of the present disclosure. The substrate 152 may be a printed circuit board (PCB), interposers, or other electronic packages, which may include a plurality of conductive layers, separated by insulating layers, suitable for electrically connecting integrated circuits (ICs) and other electronic components.

The processor 112 may be a microprocessor or other digital logic chip requiring access to memory devices. In certain embodiments, the processor 112 may also be useful in conjunction with the logic chip 102 in performing operations such as memory read and write operations, and logical functions useful in detecting and mitigating TSV and memory errors. The link 114 may include one or more high-speed serial or parallel channels, designed into substrate 152, that electrically connect processor 112 with stacked memory device 101, and may be useful in providing a channel for the communication of signal types such as address, command, and data values between the processor 112 and the stacked memory device 101. Link 114 may include, but is not limited to memory interfaces defined by industry standards, such as Double Data Rate (DDR), DDR2, DDR3, Serial Advanced Technology Attachment (SATA), SATA II, SATA III, and others.

The stacked memory device 101 (also known as a hybrid memory device) may include a plurality of memory chips 104 mounted on top of, and electrically connected to, by through-silicon vias (TSVs) 116, a logic chip 102. The compact arrangement of the memory chips 104 on top of the logic chip 102 may be useful in providing a stacked memory device with a small form-factor and footprint, reduced power consumption and increased performance, relative to a similar memory device fabricated from individually packaged memory chips. The memory chips 104 may include any number of dynamic random-access memories (DRAMs), static random-access memories (SRAMs), non-volatile memory devices (flash devices), or other types of semiconductor memory chips. The number of memory chips 104 mounted on logic chip 102 may be limited by chip assembly technology. As an example, in embodiments, a stacked memory device 101 may include 4 memory chips 104, and in some embodiments a stacked memory device 101 may include 8 memory chips. Embodiments may include other numbers of memory chips 104, including one or more spare memory chips.

The logic chip 102 may be useful in facilitating the efficient operation of processor 112 by performing memory management tasks related to memory chips 104. Memory management tasks may include reading, writing, and buffering data, as well as maintenance operations such as data refresh and data scrubbing. The logic chip 102 may also perform error-correcting code (ECC) generation, parity generation, and similar operations, which may be useful in detecting TSV and memory chip defects. The logic chip 102 may be a type of processor chip, a memory controller chip or a memory buffer chip, and may have circuitry designed to write data (a write data value) into various locations (words) in a memory chip and read data (a read data value) from various locations in the memory chip. Logic chip 102 may also be designed to detect bit errors (through data value comparison, or ECC generation) in the read data value, and may also record a bit number corresponding to a detected bit error. A memory controller function may be included in the processor 112, in the logic chip 102, or in another chip or functional unit.

The stacked memory device 101 may be a useful component of computer and other electronic systems by providing dense, power-efficient, high-performance data storage for one or more coupled processor units, while requiring little or no processor activity to manage data storage, retrieval and maintenance operations.

Figure 2:
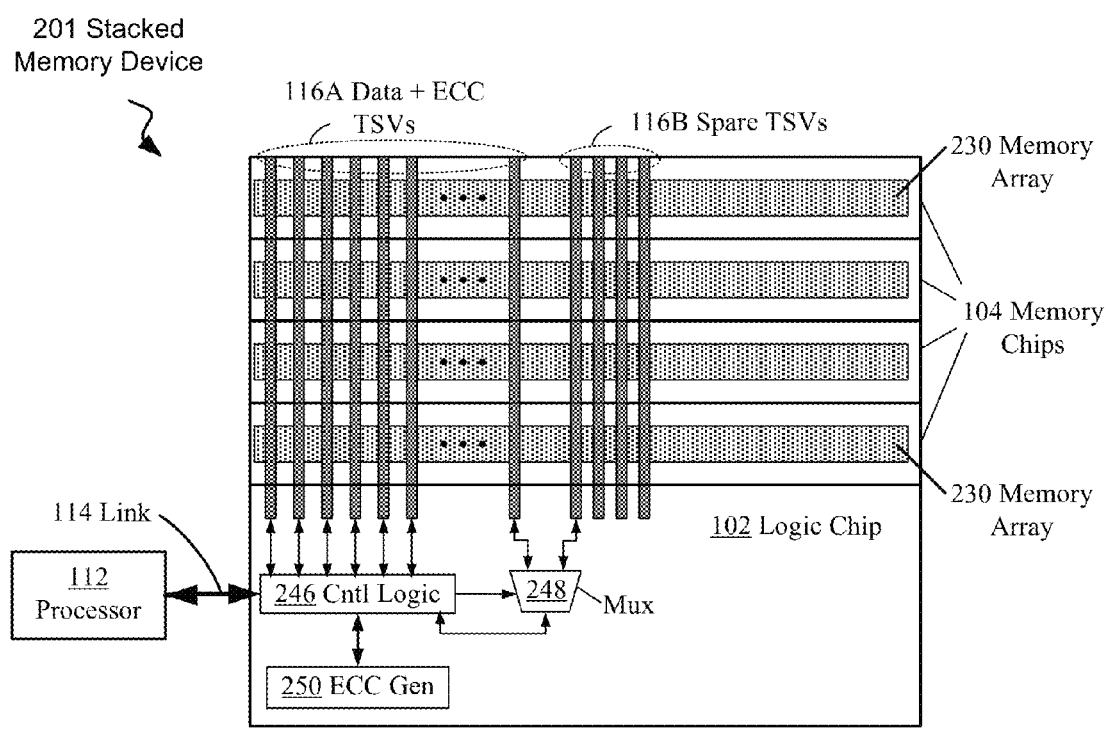
FIG. 2 includes a cross-sectional drawing of a stacked memory device and a block diagram of the logic chip within the stacked memory device, according to embodiments.

FIG. 2 includes a cross-sectional drawing of a stacked memory device 201, and a block diagram of a logic chip 102, within the stacked memory device 201, including a link 114 to processor 112, according to embodiments consistent with FIG. 1. The stacked memory device 201 may include memory chips 104 stacked on top logic chip 102. TSV groups 116A and 116B may interconnect memory chips 104 to each other and to logic chip 102. TSVs 116A may be useful to interconnect data and ECC nodes common to the memory arrays 230 within memory chips 104, to the control logic 246 of logic chip 102. TSVs 116A may also be subject to electrical and mechanical defects during the fabrication, assembly, and operation phases of stacked memory device 201. TSVs 116B may be useful as spare connections, to replace one or more defective TSV 116A connections; if a defective TSV 116A is detected. In some embodiments, TSV groups 116A and 116B may be interspersed to provide local replacements for defective TSVs.

Control logic 246 may be used to control multiplexer 248, to allow memory chip signals such as data bits and ECC bits to be rerouted from a defective TSV (one of 116A) to a spare TSV connection (one of 116B). Multiplexer 248 may be used to replace a defective TSV connection (one of 116A) by deactivating it and activating a spare TSV connection (one or more of 116B).

Control logic 246 may also be useful as an interface between processor 112 and logic chip 102, and may be used to control read, write and maintenance operations with memory chips 104. Control logic 246 may also access error-correcting code (ECC) generator 250, which may be useful in generating ECC codes for the detection of bit errors within memory chips 104. A bit error may involve a particular bit being "stuck" at a particular logic value (0 or 1), "floating" (not consistently maintaining the value written into the memory cell), or replicating the value of another bit. Control logic 246 may also be used to test each of memory chips 104 by writing and reading data values into memory locations within one or more memory arrays 230, and comparing read data values in order to determine one or more sources (TSV defect or memory cell defect) of bit errors.

Figure 3:
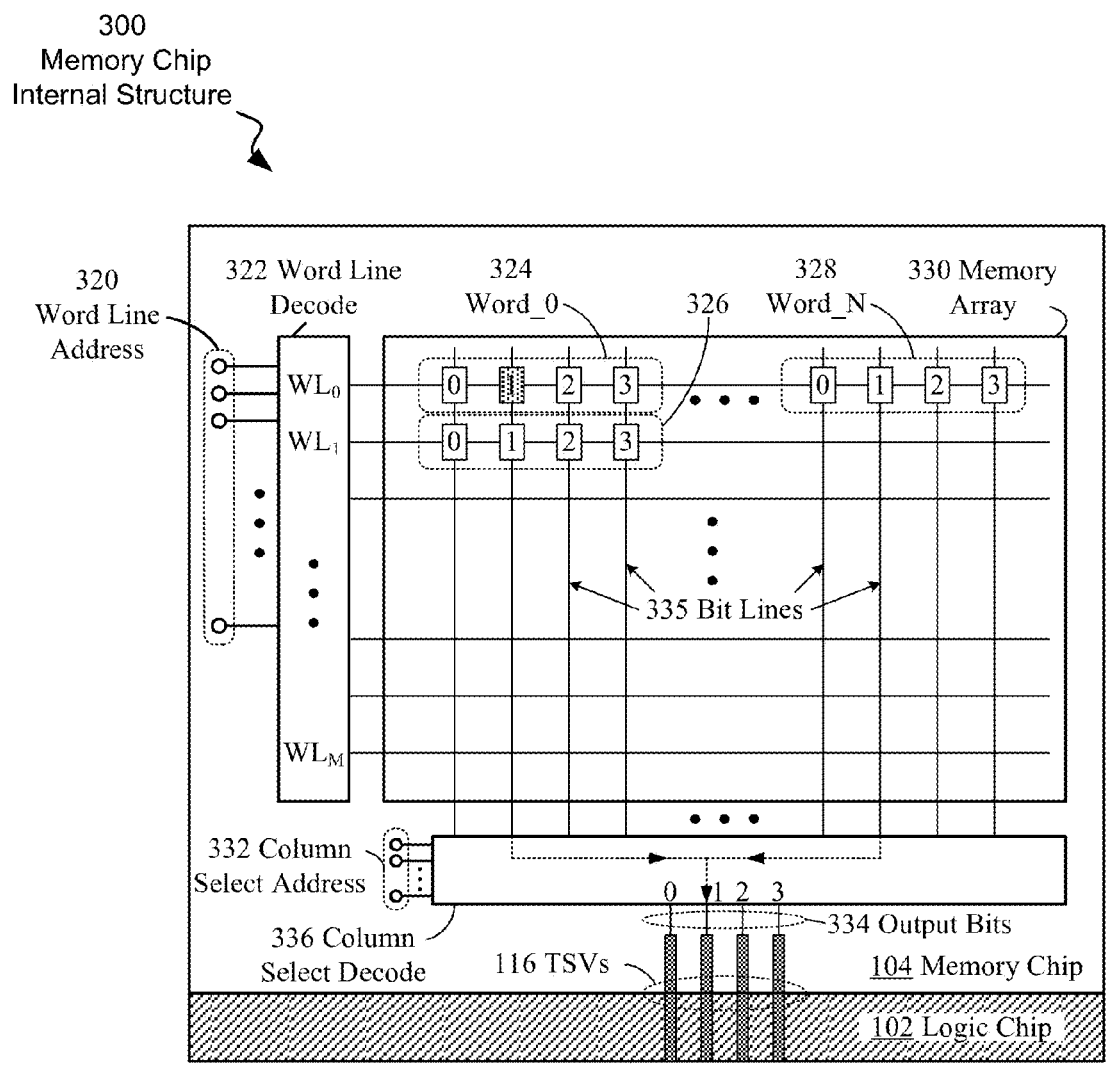
FIG. 3 includes a block diagram of a memory chip and TSV connections between the memory chip and a logic chip, within a stacked memory device, according to embodiments.

FIG. 3 includes a block diagram showing an example of a memory chip internal structure 300 within a stacked memory device (201, FIG. 2) and TSV connections 116 between the memory chip 104 and a logic chip 102, according to embodiments consistent with FIG. 1, FIG. 2. Memory array 330 contains a plurality of memory words (locations) 324, 326 and 328, each having a plurality of bits (0, 1, 2, 3), each corresponding to memory cells which may be accessed by an appropriate combination of asserted/selected word lines ($WL_0$, $WL_1$ ... $WL_M$) and bit lines 335. Word line decode 322 may receive a word line address 320, decode it, and assert one of the word lines ($WL_0$, $WL_1$ ... $WL_M$). The bit values contained in memory words accessed by a particular word line may then be received by column select decode 336. The accessing of memory words contained in memory chips of certain technology types, such as DRAM, may further involve the sensing, amplification, and latching of bit values read from memory cells. Column select decode 336 may, in response to column select address 332, allow the bit values of a selected word to be presented on output bits 334. Output bits 334 may be connected through TSVs 116 to logic chip 102.

The memory structure described may allow the contents of a plurality of bit locations (memory cells) within the memory array 330 to be presented on a particular output bit (0, 1, 2, 3) of output bits 334, which may be useful in determining whether a particular bit error is caused by a memory array 330 defect, or a TSV 116 defect. For example, if a logical 1 is written into bit 1 of a first word (location) 324 and a second word 326 (which are accessed by common bit lines), and reading both words 324 and 326 yields a logical 0 at bit 1 of output bits 334, then the cause of both bit errors may be a defective TSV defect between memory chip 104 and logic chip 102, or may be a defective bit line 335. As another example, if a logical 1 is written into a first word (location) 324 and a second word 328 (which are accessed by a common word line), and reading both words 324 and 328 yields a logical 0 at bit 1 of output bits 334, then a TSV defect may be the cause of both bit errors. If a logical 1 is written into a particular bit in two separate words (e.g., 324, 326), and reading both words yields a logical 0 (in output bits 334) from the word 324, and a logical 1 from the word 326, then the bit error may be to due a defect in the word 324 of the memory array 330, but a TSV shared by words 324 and 326 may be functional. Detecting of bit errors may include comparing a first write data value, written to a memory array location, to a first read data value, read from the same memory array location. Bit errors may also be detected by performing an ECC operation on data a first read data value, read from a memory array location. FIG. 3 depicts the internal structure of a memory chip; other memory chips arranged in a stacked memory device may have a similar internal structure. Embodiments may use memory chips having a variety of internal structures that include a plurality of word lines, bit lines, memory locations and shared output bit lines. While FIG. 3 includes memory words having 4 bits, it may be appreciated that a word may include any number of bits (e.g., 2, 4, 8, 16, 32, 64, or more, and may contain extra bits for parity or ECC functions).

Figure 4:
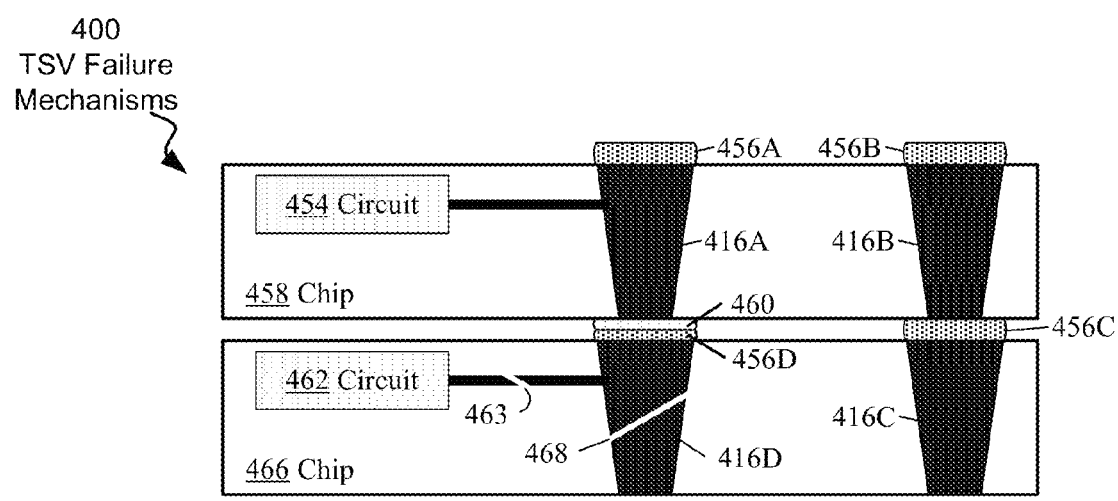
FIG. 4 is a cross-sectional drawing depicting possible failure mechanisms of TSV structures, according to embodiments.

FIG. 4 is a cross-sectional drawing depicting possible through-silicon via (TSV) failure mechanisms 400, according to embodiments. TSVs (e.g., 416A, 416D) may be useful in interconnecting circuits such as 454, 462, of different stacked chips (e.g., 458, 466, respectively). A TSV of one chip may be electrically connected to the TSV of another chip stacked above or below it through a solder bump (microbump), e.g., 456A, 456B, 456C, a solder ball, a conductive elastomer, or other conductive material. TSV 416B, solder bump 456C and TSV 416C depict a functional, electrically connected TSV stack.

TSVs may develop electrical and/or physical defects during a manufacturing process, an assembly process, or during operation of a chip stack or device. TSV 416A, solder bump 456D and TSV 416D depict an electrically disconnected TSV stack, having multiple TSV defects. One type of TSV defect is depicted by oxide layer 460 and (reduced thickness) solder bump 456D. This type of defect may occur as a result of insufficient solder between TSV 416D and TSV 416A, or as a result of the growth of an oxide layer 460 during an assembly operation, and may result in an electrical open circuit between TSV 416A and TSV 416D. Another type of defect may include a crack or void in a TSV structure, such as 468, which may result in an electrical open between TSV 416A and a bottom of TSV 416D. A wire connected to a TSV may also develop a crack or break 463, resulting in an open connection between circuit 462 and TSV 416D. TSV electrical defects are not limited to the types depicted; other types may include short-circuits, high resistance connections, and other types of open circuits. Defects may manifest themselves as nodes or bits stuck at a constant logical value (0 or 1), as a floating node (electrically disconnected), or as a node constantly connected to another, possibly physically adjacent, node, depending on the defect and associated circuit types.

The relatively small dimensions of TSV structures (e.g., a TSV diameter may be 10 μm or less), combined with TSVs and associated defects being hidden among a stack of chips, may make detection and repair of TSV defects difficult. TSV defects may be manifested during a manufacturing, assembly, testing, or operational phase of a device, and may appear as constant or intermittent electrical failures. A particular type and location of TSV defect may be determined through writing and reading data patterns to particular locations in a memory chip. The results of a comparison of read data values to written data values may indicate both the location and the type of TSV defect. The highly interconnected nature of stacked chips connected with TSVs may cause a particular TSV defect to adversely affect the operation of multiple chips within a stacked device, such as stacked memory device 201 (FIG. 2).

Figure 5:
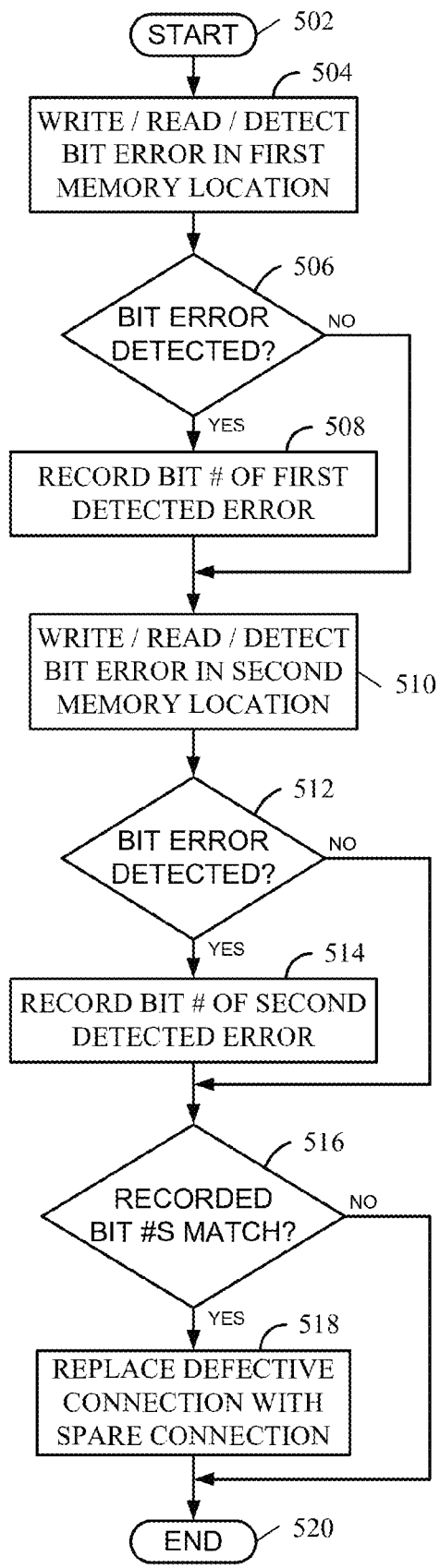
FIG. 5 is a flow diagram illustrating a method for testing a stacked memory device, according to embodiments.

FIG. 5 is a flow diagram illustrating a method for testing a stacked (hybrid) memory device for a connection defect, according to embodiments. The operations and decisions illustrated in FIG. 5 may be performed by a logic chip such as 102 (FIG. 1), or a processor chip such as 112 (FIG. 1). The method 500 may be executed upon the detection of an ECC error during normal operation of the stacked memory device. For example, processor chip 112 (FIG. 1) or logic chip 102 (FIG. 1) may detect an ECC error when reading data from memory chips 104 (FIG. 1), and may initiate the execution of the steps of method 500. The method 500 may also be executed upon detection of an ECC error during a maintenance operation of the stacked memory device. A maintenance operation, such as memory scrubbing, may be performed during a boot-up of a computer or electronic system, or may be scheduled to occur at intervals during the operation of the system.

The process 500 moves from start 502 to operation 504. Operation 504 generally refers to performing a first test of a first memory chip by writing a write data value into a first memory location, reading a read data value from the first memory location, and performing operations that may detect a bit error in the first memory location. The write data value may be designed to reveal a particular type of connection defect, which may be indicated by one or more ECC codes. For example, if an ECC error code that was used to initiate the process 500 indicates a particular bit may be held (stuck) at a logical 1 value, the write data value may include a logical 0 in that bit position, which may be useful in detecting and revealing the "stuck at 1" type of bit error.

A bit error may be detected by comparing the first write data value to the first read data value, in order to isolate differences between the data values. A bit error may also be detected by performing an ECC operation on the first read data value, and interpreting the ECC code resulting from the ECC operation. In some embodiments, the operations of writing the first write data value into a memory location and reading the first data value from the memory location may be repeated, and may include a single-bit error correction (using an ECC correction algorithm), in order to eliminate soft data errors. Once the data write, read and detect operations are completed the process moves to decision 506.

At decision 506, the result of the bit error detect operations in operation 504 are evaluated to determine if a first bit error was detected. If a first bit error is detected, then the process moves to operation 508. If a first bit error is not detected, then the process moves to operation 510.

Operation 508 generally refers to recording a first bit number corresponding to a detected (first) bit error. In embodiments, a first bit number may be recorded in a memory location within a processor (e.g., 112, FIG. 1) or within a logic chip (e.g., 102, FIG. 1), or within an attached memory device. Once the bit number is recorded, the process moves to operation 510.

Operation 510 generally refers to performing a second test of a first memory chip by writing a write data value into a second memory location, reading a read data value from the second memory location, and performing operations that may detect a bit error in the second memory location. A bit error may be detected by comparing the second write data value to the second read data value, in order to isolate differences between the data values. In some embodiments, the second write data value may be equal to the first write data value (used in operation 504). In embodiments the second location in the first memory chip may be accessed using a word line used to access the first location in the first memory chip (operation 504). In some embodiments the second location in the first memory chip may be accessed using a bit line used to access the first location in the first memory chip (operation 504).

A bit error may also be detected by performing an ECC operation on the second read data value. In some embodiments, the operations of writing the second write data value into a memory location and reading the second data value from the memory location may be repeated, and may include a single-bit error correction (using an ECC correction algorithm), in order to eliminate soft data errors. Once the data write, read and detect operations are completed the process moves to decision 512.

At decision 512, the result of the bit error detect operations in operation 510 are evaluated to determine if a second bit error was detected. If a second bit error is detected, then the process moves to operation 514. If a second bit error is not detected, then the process moves to operation 516.

Operation 514 generally refers to recording a second bit number corresponding to a detected (first) bit error. In embodiments, a second bit number may be recorded in a memory location within a processor (e.g., 112, FIG. 1) or within a logic chip (e.g., 102, FIG. 1), or within an attached memory device. Once the bit number is recorded, the process moves to operation 516.

At decision 516, the first and second recorded bit numbers are compared. If the first and second recorded bit numbers match, then the process moves to operation 518. If the first and second recorded bit numbers do not match, then the process may end at block 520.

Operation 518 generally refers to replacing a defective connection with a spare connection. If the recorded bit numbers (corresponding to bit errors) match (operation 516), a multiplexer may be used to deactivate a defective connection (e.g., a TSV) between the memory chips and the logic chip, and to activate a spare connection between the memory chips and the logic chips. For example, a section of control logic such as 246 (FIG. 2) may be used within a logic chip such as 102 (FIG. 2) to control a multiplexer 248 (FIG. 2), which may be used to deactivate a defective connection and activate a spare connection. Once the defective TSV connection has been replaced, the process 500 may end at block 520.

If process 500 ends with no matching recorded bit numbers (as a result of decision 516), process 500 may be executed again, using one or more memory locations different than ones previously used, in order to determine a defective TSV or a defective memory chip or memory location within a chip.

In some embodiments, method 500 may include marking, in response to a recorded bit number corresponding to a bit error, the first memory chip as unusable. For example, a logic chip 102 (FIG. 2) may record a particular memory chip (one of memory chips 104, FIG. 2) as unusable by recording data corresponding to the memory chip within a memory location within logic chip 102. The logic chip 102 may, for example, be designed to only access memory chips that are not marked unusable (fully functional). In some embodiments, a memory chip may be marked as unusable after a certain number of bit errors have been detected (e.g., 8) in memory locations on the chip.

In embodiments, method 500 may include marking, in response to a recorded bit number corresponding to a bit error, a region of the first memory chip as unusable. For example, a logic chip 102 (FIG. 2) may record a particular word or group of words of a memory chip (one of memory chips 104, FIG. 2) as unusable by recording data corresponding to the word location and the memory chip within a memory location within logic chip 102. The logic chip 102 may, for example, be designed to contain data corresponding to multiple non-functional word locations within each memory chip, and may be designed to not access word locations marked as non-functional.

According to certain embodiments, recorded bit numbers corresponding to bit errors may be logged and made available for system maintenance purposes. For example, a log including the number of instances of recorded bit errors in a particular memory chip, in a particular area of a memory chip, or in a stacked memory device may be made available to a system administrator or other individual. Data in the log may be useful in highlighting failing memory chips, stacked memory devices and TSV structures, and may facilitate preventative maintenance actions which may reduce memory device and related system failures and downtime.

In embodiments, the method 500 may be performed on a second memory chip of the plurality of memory chips in the stacked memory device. In some embodiments, the method 500 may be performed on each memory chip of the plurality of memory chips, in a sequence starting with a memory chip furthest away from the logic chip (on the top of the stacked memory device), and ending with the memory chip closest to the logic chip. Embodiments may also include the method 500 being performed on memory chip of the plurality of memory chips, in other sequences. Sequences may include, but are not limited to one starting with a memory chip closest to the logic chip, and ending with a memory chip furthest away from the logic chip, or sequences starting with a memory chip identified by an ECC error code, progressing towards or away from the logic chip.

In embodiments that include executing method 500 on multiple memory chips, the test results (discrepancies between written and read data, and recorded bit error data) from one or more memory chips may be compared to the test results from other memory chips, and the results of the comparisons may be used to determine the location of the cause of a particular bit error. For example, if a bit error corresponding to a particular TSV is detected as a result of testing a first memory chip, and of the same bit error, corresponding to the same TSV, is detected as a result of testing other chips in the stacked memory device, then it may be determined that the particular TSV is the cause of the bit error. If a particular bit error which may correspond to a particular TSV, only appears in response to testing one particular memory chip, for example, a chip closest to the logic chip, but does not appear in response to testing other memory chips above it, then it may be determined that the source of the bit error is not a corresponding TSV, but may be located in a memory cells within the memory chip.

The method 500 may be useful in detecting a plurality of different types of bit errors within a memory chip. For example, it may be used to detect "stuck" bit errors involving a bit that is held (stuck) at a certain logic value, "floating" bit errors, and bit errors involving bit values that may be tied (short-circuited) to the value of another memory cell.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A stacked memory device comprising:
   a plurality of memory chips each having a plurality of memory locations, a plurality of bit lines and a plurality of word lines; and,
   a logic chip having electrical connections to, and located beneath, each of the plurality of memory chips, and designed to:
   write a write data value into a location of the plurality of memory locations in a memory chip of the plurality of memory chips;
   read a read data value from the location in the memory chip;
   detect a bit error in the read data value;
   record a bit number corresponding to a detected bit error; and,
   replace a defective connection between at least one of the plurality of memory chips and the logic chip, with a spare connection.

2. The stacked memory device of claim 1, wherein the electrical connections are through-silicon vias (TSVs).

3. The stacked memory device of claim 1, wherein the logic chip is a member of a group consisting of: a processor chip, a memory controller chip and a memory buffer chip.

4. The stacked memory device of claim 1, wherein a multiplexer is configured to replace the defective connection with a spare connection.

* * * * *